United States Patent [19]

Hanson

[11] Patent Number: 5,631,969
[45] Date of Patent: May 20, 1997

[54] SYSTEM FOR LIMITING THE MAGNITUDE OF SAMPLED DATA

[75] Inventor: Van E. Hanson, Forest, Va.

[73] Assignee: Ericsson Inc., Research Triangle Park, N.C.

[21] Appl. No.: 399,218

[22] Filed: Mar. 6, 1995

Related U.S. Application Data

[63] Continuation of Ser. No. 36,729, Mar. 25, 1993, abandoned.
[51] Int. Cl.$^6$ ..................................................... H03G 3/00
[52] U.S. Cl. ............................ 381/107; 375/296; 327/180
[58] Field of Search ................................ 381/106, 107, 381/108, 104; 375/296; 327/180

[56] References Cited

U.S. PATENT DOCUMENTS

| | | | |
|---|---|---|---|
| 4,701,953 | 10/1987 | White | 381/106 |
| 4,839,906 | 6/1989 | Leveque et al. | 375/37 |
| 4,882,762 | 11/1989 | Waldhauer | 381/106 |

*Primary Examiner*—Forester W. Isen
*Attorney, Agent, or Firm*—Nixon & Vanderhye P.C.

[57] ABSTRACT

An analog signal is sampled at sampling rates which are low relative to the highest frequency components of the analog signal. The digitized sample signals are processed and amplitude limited in a digital signal processor. Real and imaginary components for each data sample are determined. The magnitude of the complex phasor corresponding to the data sample is calculated using those real and imaginary components. If the calculated magnitude of the complex phasor exceeds a preset limit, then the sample is scaled by a suitable scaling factor, (i.e. the ratio of the preset limit to the actual calculated phasor magnitude) without changing the phase of the input sample. By operating at minimum sampling rates, digital signal processing resources are conserved while still reliably limiting the processed signal.

29 Claims, 5 Drawing Sheets

SYSTEM FOR LIMITING THE MAGNITUDE OF SAMPLED DATA

This is a continuation of Ser. No. 08/036,729, filed Mar. 25, 1993, now abandoned.

BACKGROUND AND SUMMARY OF THE INVENTION

The present invention relates to a system including both a method and an apparatus for limiting the magnitude of sampled data. In particular, the system relates to limiting the magnitude of data signals, particularly when sampled at low sampling rates, using a digital signal processor.

Many techniques may be used for peak limiting signals so that their magnitude does not exceed a predetermined maximum level. Analog techniques for limiting signal magnitude may be implemented in a variety of manners including fast-attack, slow-release, automatic gain controlled (AGC) amplifiers; diode audio frequency clippers; diode radio frequency clippers; and fast-attack, slow-release AGC amplifiers employing delay lines.

Unfortunately, limiting the magnitude of sampled data signals in a digital signal processing context is difficult to accurately and easily implement. One intuitive approach is to simply limit each sampled data point to a maximum level. This approach, however, is unacceptable at lower sampling rates as is explained below.

It is well known that an analog signal can be adequately digitally represented and processed as long as it is sampled at a rate greater than the Nyquist sampling rate, i.e. at twice the highest frequency component of the sampled signal. Moreover, practical systems often require the lowest possible sampling rate (approaching the Nyquist rate) be used to conserve digital signal processing time. At these lower rates, signals may be sampled only twice a cycle. As a result, at particular points in the signal cycle (i.e., phase) the samples may not exceed the limit level, even though the peak magnitude of the sampled analog signal in fact exceeds the limit level.

This problem is illustrated in FIG. 1(a) where an analog input waveform 10 exceeds a magnitude limit level, shown as a dotted line, during the peak portions of each cycle. An ideal band-limited limiter circuit such as that shown in FIG. 1(b) attenuates the input signal 10 so that an ideal waveform 14 would be output to prevent signal distortion. Such an ideal band-limiter is frequently used in radio transmission paths, and a periodic input signal, i.e. a sinusoid, is amplitude limited in an analog limiter 11 to produce a clipped waveform 12. A low-pass filter 13 smooths out the clipped waveform to produce the ideal band-limited output signal 14.

In a digital context, if sampling occurs during one cycle at 0°, 90°, 180°, and 270° as indicated by the triangular points on waveform 10, then it is possible to approach this ideal model and generate a properly limited output signal. However, if the data sampling point is phase shifted by 45°, as indicated by the square sample points on input waveform 10, the magnitude of all samples is less the limit level, and the erroneous conclusion is reached that no signal limiting is required. As a result, signals that should be limited may not be limited at low sampling rates.

Unfortunately, when the signal is sampled at low sampling rates, it is inevitable that at some point the samples will not be properly limited. Consequently, when the unlimited sampled signal is later reconstructed in a digital to analog converter, the output analog waveform exceeds the desired limit level and exhibits objectionable distortion, especially when the frequency of the analog input signal is at or near a subharmonic of the sample rate.

The above example demonstrates clearly that the maximum level of the reconstructed output signal depends unpredictably (and objectionably) upon the phase of the input signal at sampling. One potential solution to these problems is to interpolate the sampled signal to effectively increase sampling to several times the Nyquist sampling rate to provide more samples per signal cycle. The major drawback with this approach is the significant increase in digital signal processing time required to perform the interpolation and then to process the data at the higher sampling rate making this approach impractical.

Another approach would be to perform automatic gain control by averaging several samples and computing a time averaged gain constant which is then used to scale every sample. Unfortunately, this solution requires the limiter to work virtually instantaneously to ensure that no portion of the signal exceeds the given magnitude limit. Conventional AGC functions are not fast enough to work instantaneously.

The present invention overcomes the limitations and drawbacks of the above described approaches to limiting the magnitude of sampled data signals. Each data input sample, corresponding to a real component of the sample, is used to generate the imaginary component of a complex vector corresponding to the input sample by adding 90° of phase shift to the sample. The magnitude of the complex phasor of the data sample is then calculated by taking the square root of the sum of the squares of the real and imaginary components. If the calculated magnitude of the complex phasor exceeds a preset magnitude limit, then the sample is scaled by a scaling factor, i.e. the ratio of the calculated phasor magnitude to the preset magnitude limit. In this way, the data sample is limited irrespective of where (and when) the sample occurs in the analog input signal cycle. Moreover, the limited sample has the same phase as the input sample, and low sampling rates may be used without the disadvantages noted above.

Thus, the present invention provides a method for limiting the magnitude of an input signal where the input signal is sampled and transformed to obtain its component in-phase and quadrature components. The phasor magnitude of the signal sample is determined from those in-phase and quadrature components, and the input sample is limited based on the relationship of the phasor magnitude to a predetermined limit value. Specifically, the limiting step includes scaling the sample input signal using a ratio of the predetermined threshold to the phasor magnitude.

The present invention may be used in an audio signal processing environment to limit the magnitude of a digitized analog audio signal. The analog audio signal is sampled at a sampling rate that is low relative to the frequency of the analog audio signal to generate an input sample. The input sample is transformed into its complex real and imaginary components using a Hilbert transform. The magnitude of the complex signal corresponding to the input signal is determined, and that complex magnitude is then compared to a predetermined threshold. If the complex magnitude exceeds that threshold, the input sample is scaled by the ratio of the predetermined threshold to the complex magnitude. The scaled input signal is then converted to analog form.

The present invention provides for a signal processing system for processing analog audio frequency signals. A first CODEC converts analog signals into digitized input samples. A digital signal processor receiving the digitized samples includes means for transforming each sampled input signal to obtain its in-phase and quadrature components; means for calculating a complex phasor of the sampled input signal from the in-phase and quadrature components; means for comparing a complex magnitude to a threshold value; and means for limiting the input signal based on the comparison. A second CODEC then converts the limited sample signals, generated by the means for limiting, into an appropriately limited analog output signal.

The present invention effectively limits the magnitude of signals at very low sample rates, i.e. approaching the Nyquist sampling rate. By operating at minimum sampling rates, digital signal processing resources are conserved. In addition, a large linear region of operation is provided for the limiter according to the present invention, e.g. approximately 85% of the maximum output level. The remaining margin of 15% is necessary to compensate for overshoot in digital-to-analog conversion of output signals from the digital signal processor.

BRIEF DESCRIPTION OF THE DRAWINGS

The present invention will become more fully understood from the detailed description given hereinbelow with reference to the accompanying drawings which are given by way of illustration only, and thus are not limitive of the present invention, and wherein.

DETAILED DESCRIPTION OF THE PREFERRED EMBODIMENT

In the following description, for purposes of explanation and not limitation, details are set forth such as particular circuits, certain components, interfaces, techniques, etc. in order to provide a thorough understanding of the present invention. However, it will be apparent to those skilled in the art that the present invention may be practiced in other embodiments set apart from these specific details. In other instances detailed descriptions of well known methods, techniques, devices, and circuits are omitted so as to not obscure the description of the present invention with unnecessary details.

Figure 1A:
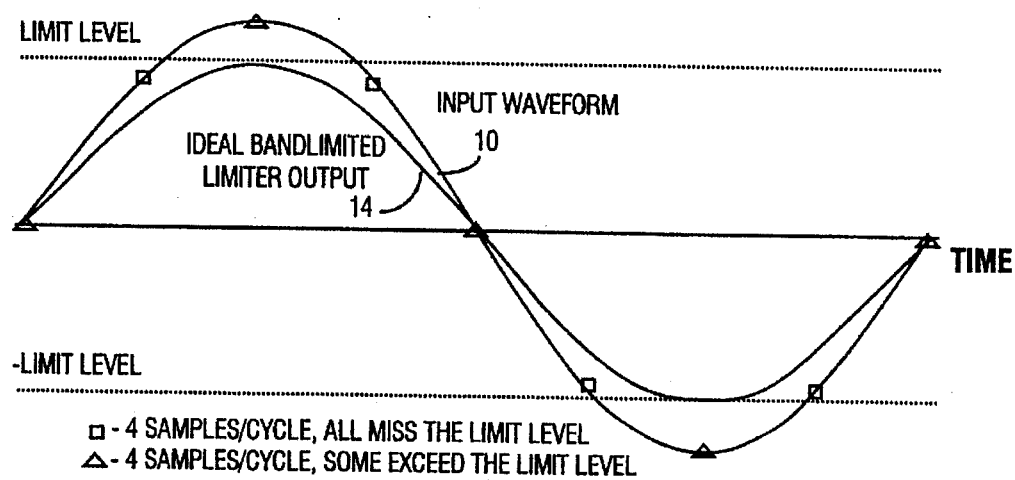
FIG. 1(a) is a graph showing the effects of phase changes on limiting the amplitude of a sampled analog input signal.
Figure 1B:
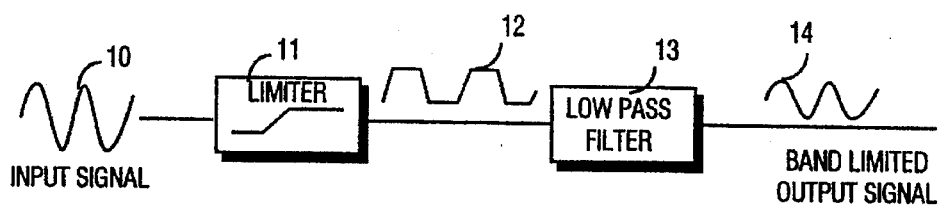
FIG. 1(b) is a block diagram of an ideal band-limited circuit.
Figure 2:
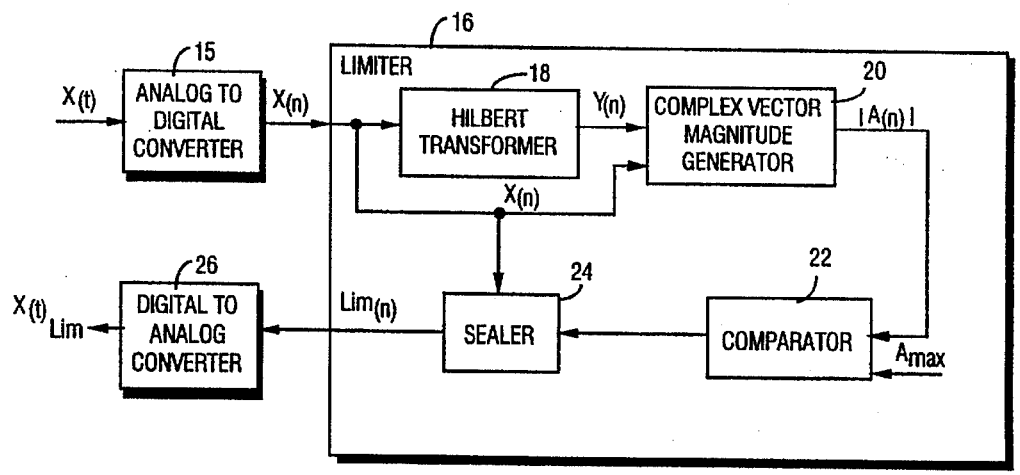
FIG. 2 is a function block diagram of one embodiment of the present invention.

Referring to FIG. 2, a general block diagram of the system for limiting the magnitude of a sampled input signal is shown. An input signal $X(t)$ is received in a conventional analog to digital converter 15 which outputs a plurality of discrete, digitized samples $X(n)$ to a limiter 16. Preferably, the rate at which the signal $X(t)$ is sampled is a relatively low sampling rate, i.e. at or just above twice the highest frequency component of the input signal $X(t)$. In the complex number domain, $X(n)$ represents the real component of a complex phasor corresponding to $X(n)$. A Hilbert transformer 18 receives each sampled input signal $X(n)$ and essentially provides a phase shift of 90° to input signal $X(n)$ to generate the quadrature or imaginary component $Y(n)$ of the input sample signal. Basic treatment of a Hilbert transformer may be found in *Principles of Communication Systems, Modulation and Noise*, Ziemer and Tranter, by Houghton Mifflin Company, 1976, pp. 72–75 which is incorporated herein by reference.

Since input sample signal $X(n)$ and Hilbert transform signal $Y(n)$ represent the real and imaginary portions of the complex vector $A(n)$, the magnitude of the complex vector $A(n)$ is determined in a complex vector magnitude generator 20 according to the following equation:

$$A(n) = \sqrt{(X(n))^2 + (Y(n))^2}$$

The complex magnitude $A(n)$ is then compared with a predetermined limit value Amax in comparator 22. If the complex vector magnitude exceeds the limit level, then the comparator outputs a scaling ratio defined as Amax/$A(n)$ to scaler 24. Scaler 24 then applies scaling ratio (if necessary) to the real portion of the signal $X(n)$ to generate an appropriately limited output sample signal Lim(n) to a digital to analog converter 26. As a result, the analog output of the digital to analog converter 26 $X(t)_{lim}$ is appropriately amplitude limited.

Figure 3A:
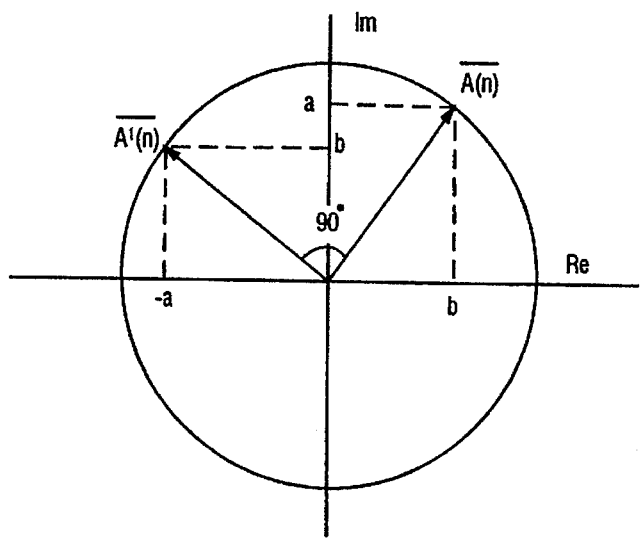
FIGS. 3(a)–3(c) are phasor diagrams illustrating the Hilbert transform and the operation of the present invention.
Figure 3B:
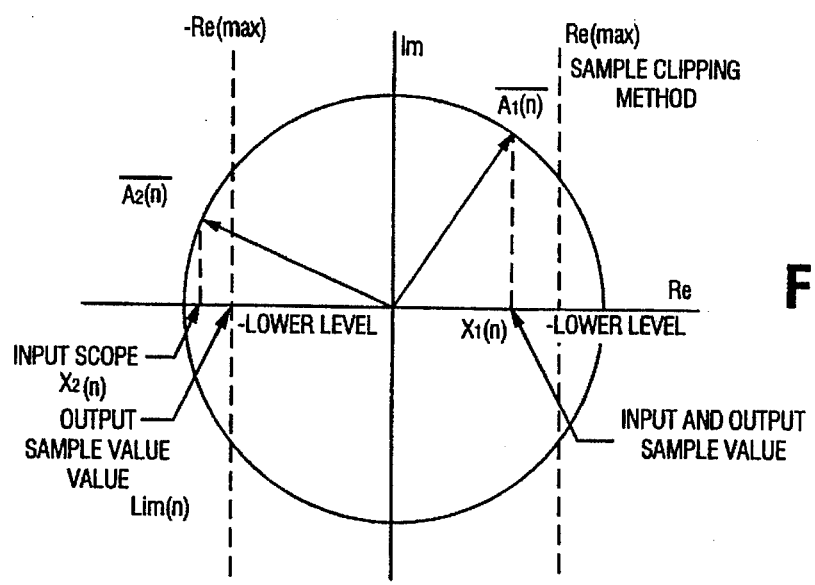
Figure 3C:
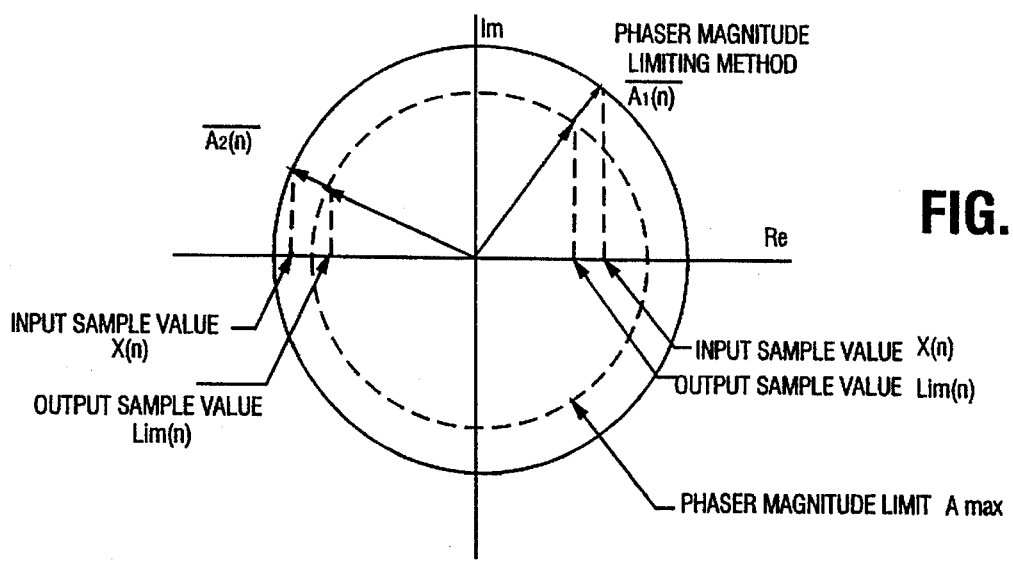

The operation of the signal limiting system shown in FIG. 2 will now be described in conjunction with FIGS. 3(a)–3(c). FIG. 3(a) illustrates in a phasor diagram the relationship between a complex vector $A(n)$ and its Hilbert transform $A'(n)$. The real components of each vector are plotted on the horizontal axis, and the imaginary components are plotted on the vertical axis. Complex vector $A(n)$ is made up of both real and imaginary parts. The real component b of $A(n)$ corresponds to the magnitude of the input sample $X(n)$ and therefore is known. To determine the magnitude of the imaginary component a, the Hilbert transform $A'(n)$ of $A(n)$ is calculated. As shown in FIG. 4(a), the magnitude of the real component of $A'(n)$ is a. Thus, the magnitude of $A(n)$ is obtained by simply calculating $A(n) = \sqrt{a^2 + b^2}$.

The limiter of the present invention is based on limiting both the real and imaginary parts of the complex vector corresponding to the input sample, rather than just the real part. As shown in FIG. 3(b), if the sample received from the analog to digital converter 14 is simply limited, only the real portion of the complex vector corresponding to the input sample signal is limited. In other words, if the real portion of the sample exceeds ±Re(max), it is limited to ±Re(max). For the exemplary sample corresponding to phasor $A_2(n)$, the real component $X_2(n)$ actually exceeds the limit level, and simply comparing the magnitude of $X_2(n)$ to the limit would effectively limit the sample. However, in the exemplary sample corresponding to complex vector $A_1(n)$, the real component $X_1(n)$ is less than the limit level Re(max) even though the complex vector $A_1(n)$ has the same magnitude as $A_2(n)$. If the sample $X_1(n)$ were not limited, the ultimately reconstructed output analog signal would easily exceed the limit level. This causes the distortion problems noted above and occurs because limiting depends on whether or not the sample is taken at a point where the real portion of an input signal exceeds the limit level.

However, if the magnitude of the complex phasor corresponding to the input sample is limited, the real portion of that limited phasor is necessarily limited, irrespective of where in its cycle it is sampled. FIG. 3(c) shows that when the complex magnitude of the example phasors $A_1(n)$ and $A_2(n)$, composed of both the real and imaginary portions of corresponding input samples, is compared with the limit value, i.e. radius Amax in the complex domain, both phasor magnitudes actually exceed that limit level. Accordingly, if the phasor magnitude is limited to that radius limit value Amax, the reconstructed analog signal will not exceed the limit value.

The present invention may advantageously be used in a preferred embodiment in an audio signal processing environment where audio signals can be effectively processed and limited at relatively low sampling rates. Preferably, the audio signal processing is implemented using a customized digital signal processor which contains a microprocessor, such as the sixteen bit, fixed point TMS320C17 microprocessor available from Texas Instruments operating at a clock speed of 19.2 MHz, which includes read only memory (ROM) and random access memory (RAM) for storing the algorithms and data necessary to implement the digital signal processing functions.

Figure 4:
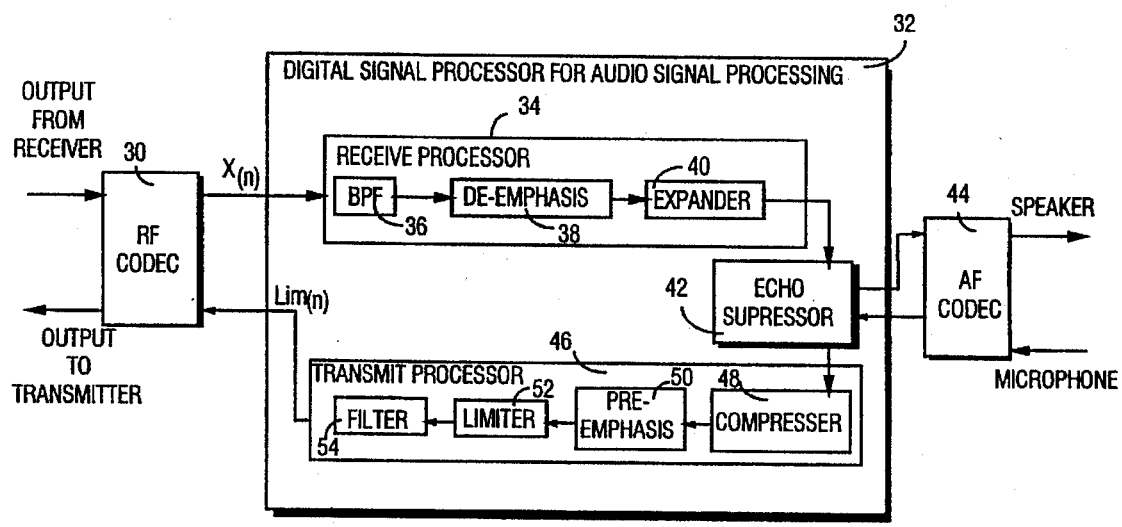
FIG. 4 is a function block diagram of another embodiment of the present invention.

FIG. 4 shows an audio signal processing system which employs the present invention and may be used for example in a cellular radio telephone. Output signals from a radio frequency (RF) receiver (not shown) are received in a conventional RF coder-decoder (CODEC) 30 such as model TCM 29C13 available from Texas Instruments which performs a number of processing functions including converting the received analog signal received into digitized sample values. A digital signal processor 32 performs well known audio receiver processing functions as represented in receive processor 34 which receives the digitized signal samples $X(n)$ and performing conventional audio signal processing functions including bandpass filtering in bandpass filter block 36, de-emphasis in function block 38 and signal expansion in expander block 40. Because these signal processing functions are well known and not the subject of the present invention, a detailed description is unnecessary. The expanded audio signal is received at a conventional audio frequency (AF) CODEC 44 also available from Texas Instruments by way of echo suppressor 42 which converts the processed digitized signals into analog form for driving a speaker.

Audio signals, such as voice signals from a microphone, are received in the AF CODEC 44 which converts the analog audio signals into digitized samples for processing in a transmit processor 46 by way of echo suppressor 42. The transmit processor 46 performs well known audio signal processing functions including signal compression in compressor 48, preemphasis in block 50, and filtering in filter 54. As noted above, these known signal processing functions are not the focus of the present invention, and therefore further description is unnecessary. The limiter 52 in transmit processor 46 provides the advantageous signal limiting functions according to the present invention and will be described as described below. The limited digitized samples, after filtering in conventional filter 54, are reconstructed into an analog signal in the RF CODEC 30 to generate a modulating input signal at an RF transmitter (not shown).

Figure 5:
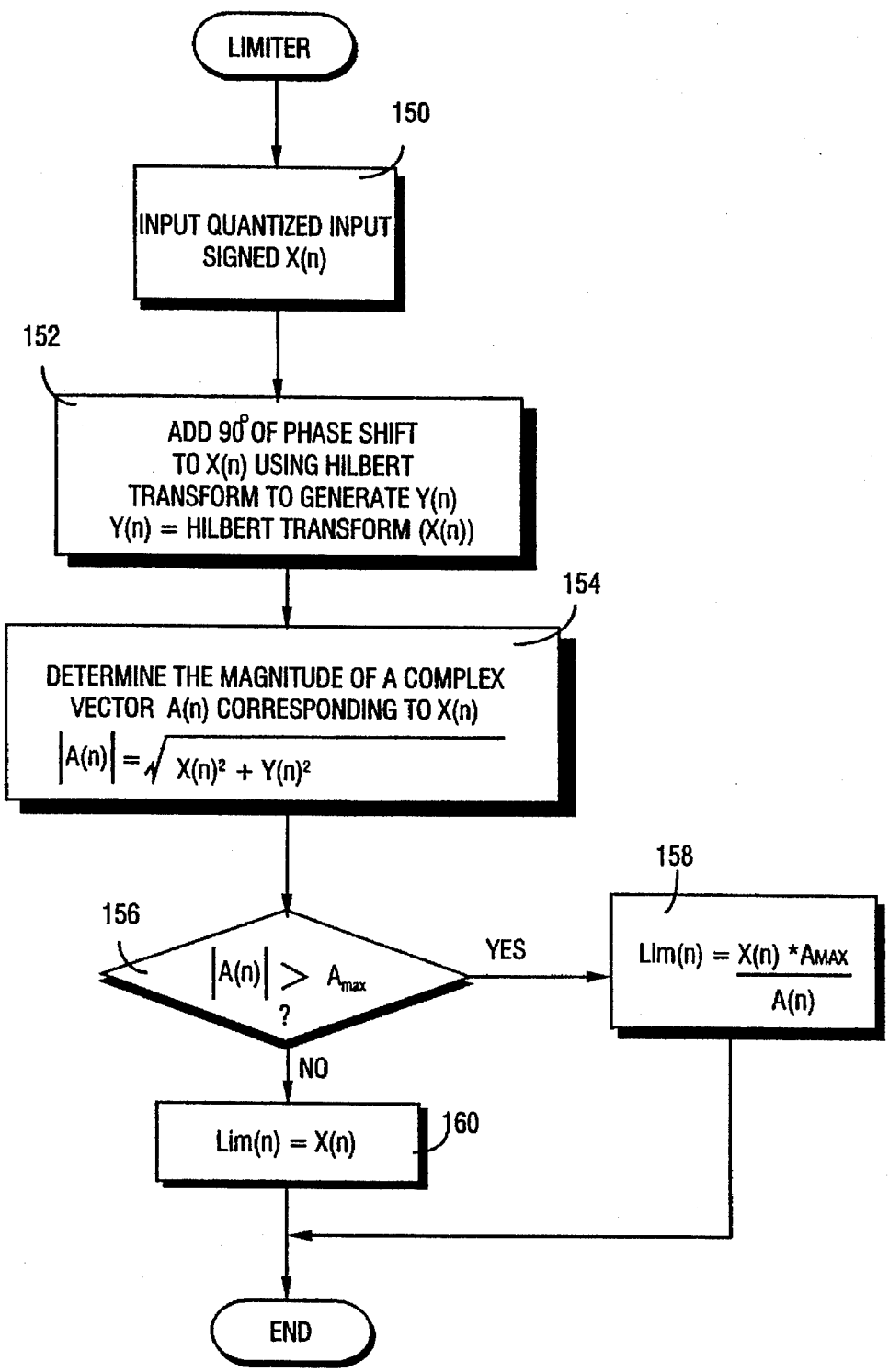
FIG. 5 is a flow diagram setting forth the processing steps for implementing a preferred embodiment of the present invention in a digital signal processor.

Each of the processing functions in receive processor 34 and transmit processor 46 are implemented via procedures executed by the digital signal processor 32. FIG. 5 shows a flow chart diagram which depicts the specific control procedures implemented by the digital signal processor 32 for limiter 52. Each quantized input sample signal $X(n)$ is input (block 150) and phase shifted by 90° using a Hilbert transform filtering algorithm (described in more detail below) to generate the imaginary component $Y(n)$ of the input sample $X(n)$ using the algorithm $Y(n)$=[Hilbert transform $(X(n))$] (block 152). As described above, the magnitude $A(n)$ of a complex vector $A(n)$ corresponding to input sample $X(n)$ is determined in block 154 according to the following:

$$A(n) = \sqrt{X(n)^2 + Y(n)^2}$$

A decision is made in block 156 to determine whether the calculated magnitude $A(n)$ exceeds a limit valve Amax. If the complex magnitude $A(n)$ does not exceed the limit, then the output signal sample LIM(n) simply equals the input signal sample $X(n)$ in block 160. However, if the complex magnitude does exceed the limit Amax, then LIM(n) is calculated by scaling the input sample $X(n)$ by the ratio of the limit value Amax to the complex magnitude $A(n)$. Thus, $X(n)$ is attenuated in proportion to the amount the complex vector magnitude $A(n)$ exceeds the predetermined limit value Amax.

As described above, the Hilbert transform provides a constant phase response of 90° phase shift for all frequencies of the input sample signal $X(n)$. The ideal analog Hilbert transformer has frequency response $H_a(\omega) = -j\,\text{sgn}(\omega)$ where the function $\text{sgn}(\omega)=1$ for $\omega>0$, $\text{sgn}(\omega)=0$ for $\omega=0$, and $\text{sgn}(\omega)=-1$ for $\omega<0$. An ideal discrete-time Hilbert transformer with delay would therefore be defined as the system whose frequency response is $$H(e^{j\omega T}) = -j\,\text{sgn}(\omega)e^{-j\omega n_o T} \qquad \omega_{c1} < |\omega| < \omega_{c2} \qquad (1)$$
$$= 0 \qquad \text{otherwise}$$

The magnitude response of the ideal Hilbert transformer is unity over the frequency band $\omega_{c1}<|\omega|<\omega_{c2}$, and the phase response is 90° plus the linear phase due to the delay of $n_o$ samples. The above equation defines the periodic frequency response over one period (i.e., $|\omega|<\pi/T$) and the cutoff frequencies must satisfy the inequalities $0<\omega_{c1}$; $\omega_{c2}<\pi/T$.

Figure 6:
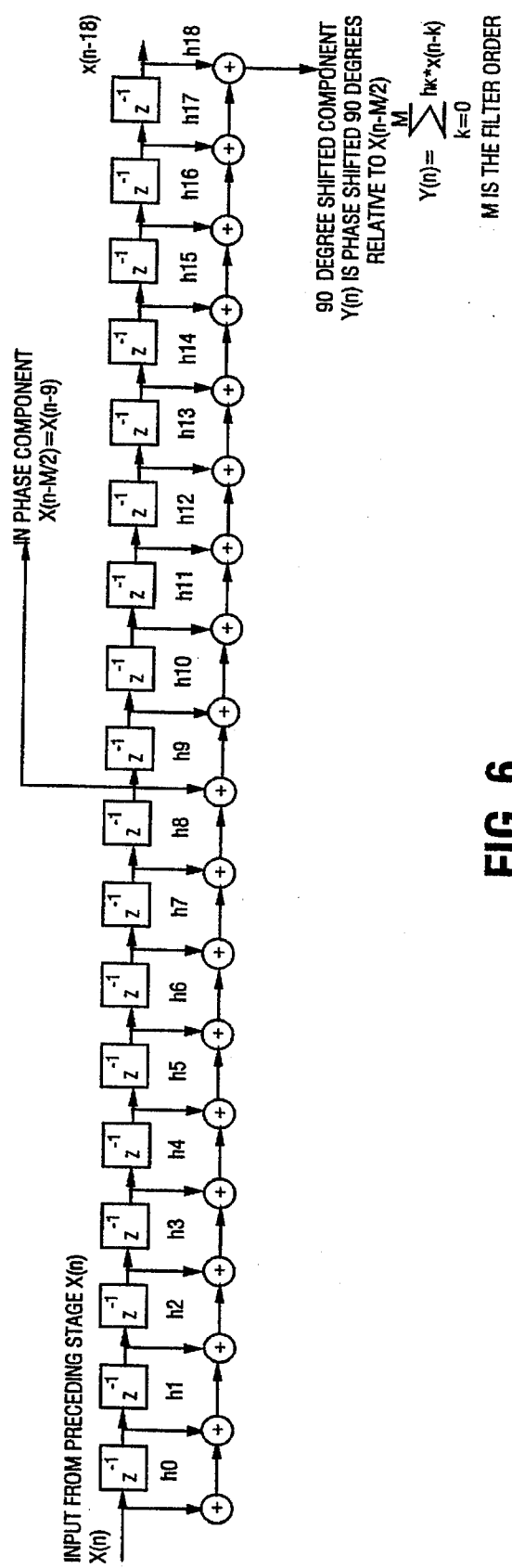
FIG. 6 is a diagram depicting the processing procedure for implementing the Hilbert transform in the digital processing embodiment of the present invention.

This system has unit sample response $$h[n] = \frac{\cos(\omega_{c1}T[n-n_o]) - \cos(\omega_{c2}T[n-n_o])}{\pi[n-n_o]} \qquad (2)$$

which although theoretically nonrealizable, can be approximated using the model shown in FIG. 6 and described below.

The input signal $X(n)$ is processed in an 18th order finite impulse response (FIR) digital filter. The blocks with $z^{-1}$ represent the delay elements used to implement the filter. Each delayed sample $x(n-k)$ is multipied by a coefficient $h(k)$ and the sum of the products $h(k)*x(n-k)$ is then calculated to determine the output of the filter. The coefficients $h(k)$ are chosen to satisfy, at least approximately, the Hilbert transformer requirements noted above in equation (2). In this particular implementation, the coefficients are arrived at through the use of a Kaiser or $I_o$-sinh window. For a detailed description reference is made to J. F. Kaiser, "Nonrecursive Digital Filter Design Using the $I_o$-sinh Window Function," Proc. 1974 IEEE Int. Symp. on Circuits and Systems which is incorporated herein by reference. This implementation has 90° degrees of phase shift in addition to M/2 samples of delay (M equals the filter order, e.g. 18). Therefore the Hilbert transformer output $Y(n)$ is shifted 90° relative to $X(n-M/2)$, i.e. $X(n-9)$. Thus, the imaginary or quadrature component $Y(n)$ of the input signal $X(n)$ is defined by the equation $$Y(n) = \sum_{k=0}^{M} h_k * X(n-k)$$

for an 18th order FIR filter, (i.e. output at the 18th stage summary).

While this particular implementation of the Hilbert transformer has been described in conjunction with the presently preferred embodiment of the present invention, those skilled in the art will of course recognize-that other algorithms could be used to implement the Hilbert transformer. In addition, while the Hilbert transformer described above is presently preferred to produce the imaginary or quadrature components of the input sample signal, other methods which produce the imaginary or quadrature components of the input sample signal could also be used.

It should be appreciated that the present invention permits the sampling of the input signal to occur at very low sampling rates approached by the Nyquist sampling rate. For example, if the highest frequency component of the input signal X(t) is 3.4 kHz then the present invention permits the input sample to be sampled at a rate of 8 kHz. While theoretically the signal could be sampled at a minimum value of twice the input frequency or 6.8 kHz, practical systems always provide for some design tolerance.

Despite these low sampling rates, the present invention, by calculating the magnitude of the complex phasor corresponding to the input data sample determines independent of the phase of the sample the amount (if any) the signal sample should be limited to prevent subsequent distortion. In addition, the present invention provides a large linear region of operation for the limiter, e.g. approximately 85% of the maximum output level with the remaining margin necessary to compensate for overshoot in subsequent digital-to-analog conversion of signals. Typical practical analog limiter circuits permit only about 70% of maximum output level. As a result, the present invention prevents distortion of the audio signal with minimum attenuation.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for producing an output signal of limited amplitude from an input signal of variable amplitude, comprising:

transforming the variable amplitude input signal to obtain an in-phase signal from the input signal and a corresponding quadrature signal from the input signal in which desired component frequencies of said quadrature signal are 90-degrees phase rotated relative to corresponding frequency components of said in-phase signal;

determining a magnitude of said variable amplitude input signal by combining said in-phase and quadrature signals obtained from the variable amplitude input signal;

comparing said determined magnitude with a limiting threshold; and if said determined magnitude exceeds said limiting threshold, scaling at least one of said in-phase or quadrature signals based on said determined magnitude to produce the output signal of limited amplitude, wherein said in-phase and quadrature signals used in said determining step are independent of said output signal.

2. The method of claim 1, wherein said input signal of variable amplitude is an electrical analog of a speech signal.

3. The method of claim 1, wherein said transforming step further comprises:

sampling said input signal at discrete times to produce a series of representative signal samples;

applying said signal samples to a multi-stage delay device to produce a number of progressively delayed samples; and combining said progressively delayed samples by weighting and adding in a first manner to obtain said in-phase signal and in a second manner to obtain said quadrature signal.

4. The method according to claim 3, wherein said sampling step includes analog to digital conversion and said series of representative signal samples are numerical values.

5. The method according to claim 1, wherein transforming step comprises sampling and analog to digital conversion of said input signal to obtain a series of input signal representative numerical values, and numerical processing of said numerical values to produce in-phase signal representative values and quadrature signal representative values.

6. The method of claim 1, wherein said determining step comprises:

forming the sum of the squares of the in-phase and quadrature signals, and forming the square root of said sum-of-squares.

7. The method according to claim 6, wherein the sum of the squares of corresponding numerical in-phase and quadrature signal representative values and the square root of said sum-of-squares is numerically computed using a numerical processor.

8. The method of claim 1, wherein said determined magnitude is equal to the square root of the sum of the squares of said in-phase and quadrature signals determined at substantially the same instant in time.

9. The method of claim 8, wherein said scaling step comprises dividing said at least one signal by said determined magnitude.

10. An amplitude limiter for processing an input signal into an output signal, comprising:

a transformer having an input port to receive the input signal and to separate the input signal into an in-phase component and a quadrature component;

an arithmetic circuit, connected to receive the in-phase component and the quadrature component, said circuit to calculate the magnitude of the in-phase and quadrature components, to compare said magnitude to a predetermined limit value and to output a gain control signal based on said comparison; and a gain control device, connected to receive the in-phase signal, the quadrature signal, and the gain control signal, and connected to output said output signal, said gain control device creating said output signal by scaling at least one of the in-phase or quadrature signals by a scaling factor controlled by said gain control signal.

11. A method for producing an output signal of limited amplitude from a variable amplitude input signal, comprising:

sampling the input signal;

transforming the sampled signal to obtain its in-phase and quadrature components;

determining the phasor magnitude of the sampled signal based only on the in-phase and quadrature components; and comparing the phasor magnitude to a predetermined limit value;

limiting at least one of the in-phase and quadrature components based on the relation of the phasor magnitude to the predetermined limit value to generate an output sample of limited amplitude, wherein said in-phase and quadrature signals used in said determining step are independent of said output signal.

12. The method according to claim 11, wherein the determining step includes determining the ratio of the threshold value and the complex magnitude.

13. A method according to claim 12, wherein the limiting step includes scaling the sampled input signal using the ratio.

14. The method according to claim 11, wherein the phase angle of the input and output samples are identical.

15. A method according to claim 11, wherein the rate of sampling is about twice the frequency of the highest frequency component of the input signal.

16. A method according to claim 11, wherein the transforming step includes transforming the sampled signal into its component real and imaginary parts using a Hilbert transform.

17. A method for limiting an output signal generated in response to an input signal comprising:
    determining the real and imaginary parts of the input signal;
    calculating the magnitude of a complex signal comprising the real and imaginary parts of the input signal;
    comparing the complex magnitude to a predetermined value;
    limiting the complex magnitude to the predetermined value; and
    generating a limited output signal based on the limited complex magnitude wherein said real and imaginary parts used in said calculating step are independent of said limited output signal.

18. The method according to claim 17, wherein the input signal and the limited output signal have the same phase angle.

19. The method according to claim 17, further comprising:
    determining the ratio of the threshold value and the complex magnitude.

20. A method according to claim 19, wherein the limiting step includes scaling the signal using the ratio.

21. A method according to claim 17, wherein the rate of sampling is approximately twice the frequency of the highest frequency component of the input signal.

22. In an audio signal processor, a method for limiting the magnitude an output signal from a received analog audio signal comprising:
    sampling the analog audio signal at a sampling rate about twice the frequency of the analog audio signal to generate an input sample;
    transforming the input sample into its complex real and imaginary components using a Hilbert transform;
    determining the magnitude of a complex signal using the real and imaginary components;
    comparing the complex magnitude to a predetermined threshold;
    if the complex magnitude exceeds the predetermined threshold, scaling at least one of the real and imaginary components by the ratio of the predetermined threshold to the complex magnitude; and
    converting the at least one scaled component to an analog output signal, wherein said step of determining is performed without feeding said output signal back to said real and imaginary components.

23. A signal processor for limiting the magnitude of an output signal from a variable amplitude input signal, comprising:
    an analog to digital converter for sampling the input signal at a sampling rate about twice the frequency of the analog audio signal to generate a digitized input sample;
    a transformer for transforming the input sample into its complex real and imaginary components;
    a processor for inputting the real and imaginary components and for determining the magnitude of a complex signal consisting of the real and imaginary components;
    a comparator for comparing the complex magnitude to a predetermined threshold;
    an attenuator for inputting at least one of the real and imaginary components and for scaling at least one of the real and imaginary components by a ratio of the predetermined threshold to the complex magnitude if the complex magnitude exceeds the predetermined threshold; and
    a digital to analog converter for converting the scaled portion of the complex magnitude to analog form.

24. A processor according to claim 23, wherein the analog to digital converter is a CODEC which samples the input signal at substantially twice the frequency of the highest frequency component of the input signal.

25. An apparatus for producing an output signal of limited amplitude from an input signal of variable amplitude comprising:
    a transformer for transforming an input signal into an in-phase signal and a corresponding quadrature signal in which desired component frequencies of said quadrature signal are 90° phase rotated relative to corresponding frequency components of said in-phase signal, and
    electronic circuitry for receiving the in-phase and quadrature signals and for performing the following processing steps including:
        determining a magnitude of said input signals by combining said in-phase and quadrature signals; and
        comparing said determined magnitude with a limiting threshold; and
    a gain controller receiving at least one of the in-phase and quadrature signals and, if said determined magnitude exceeds the limiting threshold, scaling at least one of said in-phase or quadrature signals based on said determined magnitude to produce an output signal of limited amplitude.

26. The apparatus in claim 25, further comprising a sampler for sampling said input signal at discrete times to produce a series of representative signal samples, and the transform including a Hilbert transformer for receiving said signal samples and producing a number of progressively delayed samples which are weighted and combined in a first manner to obtain said in-phase signal and in a second manner to obtain said quadrature signal.

27. The apparatus according to claim 25, wherein said electronic circuitry is a digital signal processor.

28. The apparatus as in claim 27, wherein said digital signal processor numerically computes the square root of the sum of the squares of said in-phase and quadrature signals at substantially the same instant in time.

29. The apparatus in claim 25, wherein the digital signal processor divides said one signal by said determined magnitude.

* * * * *